US009385304B2

(12) United States Patent
Nakayama et al.

(10) Patent No.: US 9,385,304 B2
(45) Date of Patent: Jul. 5, 2016

(54) MAGNETIC MEMORY AND METHOD OF MANUFACTURING THE SAME

(71) Applicants: Masahiko Nakayama, Seoul (KR); Tadashi Kai, Seoul (KR); Masaru Toko, Seoul (KR); Hiroaki Yoda, Seoul (KR); Hyung Suk Lee, Icheon-si (KR); Jae Geun Oh, Icheon-si (KR); Choon Kun Ryu, Seoul (KR); Min Suk Lee, Seongnam-si (KR)

(72) Inventors: Masahiko Nakayama, Seoul (KR); Tadashi Kai, Seoul (KR); Masaru Toko, Seoul (KR); Hiroaki Yoda, Seoul (KR); Hyung Suk Lee, Icheon-si (KR); Jae Geun Oh, Icheon-si (KR); Choon Kun Ryu, Seoul (KR); Min Suk Lee, Seongnam-si (KR)

(73) Assignees: KABUSHIKI KAISHA TOSHIBA, Tokyo (JP); SK HYNIX INC., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/203,249

(22) Filed: Mar. 10, 2014

(65) Prior Publication Data

US 2015/0069558 A1 Mar. 12, 2015

Related U.S. Application Data

(60) Provisional application No. 61/876,057, filed on Sep. 10, 2013.

(51) Int. Cl.
*H01L 27/00* (2006.01)
*H01L 43/02* (2006.01)
(Continued)

(52) U.S. Cl.
CPC ............... *H01L 43/02* (2013.01); *G11C 11/15* (2013.01); *G11C 11/16* (2013.01); *G11C 11/161* (2013.01);
(Continued)

(58) Field of Classification Search
CPC ... H01L 27/222; H01L 45/04; H01L 27/2463; G11C 11/16; G11C 11/15; G11C 11/161; G11C 11/5607
See application file for complete search history.

(56) References Cited

U.S. PATENT DOCUMENTS

| 6,165,803 A | 12/2000 | Chen et al. |
| 6,297,983 B1 | 10/2001 | Bhattacharyya |

(Continued)

FOREIGN PATENT DOCUMENTS

| JP | 04241481 A | 8/1992 |
| JP | 09041138 A | 2/1997 |

(Continued)

OTHER PUBLICATIONS

Related U.S. Appl. No. 13/226,868; First Named Inventor: Yuichi Ohsawa; Title: "Method of Manufacturing Magnetic Memory"; filed Sep. 7, 2011.

(Continued)

*Primary Examiner* — Ngan Ngo
(74) *Attorney, Agent, or Firm* — Holtz, Holtz & Volek PC (57) ABSTRACT

According to one embodiment, a magnetic memory is disclosed. The memory includes a conductive layer containing a first metal material, a stacked body above the conductive layer, and including a first magnetization film containing a second metal material, a second magnetization film, and a tunnel barrier layer between the first magnetization film and the second magnetization film, and an insulating layer on a side face of the stacked body, and containing an oxide of the first metal material. The first magnetization film and/or the second magnetization film includes a first region positioned in a central portion, and a second region positioned in an edge portion and containing As, P, Ge, Ga, Sb, In, N, Ar, He, F, Cl, Br, I, Si, B, C, O, Zr, Tb, S, Se, or Ti.

9 Claims, 9 Drawing Sheets (51) Int. Cl.
*H01L 43/12* (2006.01)
*H01L 45/00* (2006.01)
*G11C 11/56* (2006.01)
*G11C 11/15* (2006.01)
*G11C 11/16* (2006.01)
*H01L 27/22* (2006.01)
*H01L 27/24* (2006.01)
*H01L 43/08* (2006.01)
*H01L 43/10* (2006.01)

(52) U.S. Cl.
CPC .......... *G11C 11/5607* (2013.01); *H01L 27/222* (2013.01); *H01L 27/228* (2013.01); *H01L 27/2463* (2013.01); *H01L 43/08* (2013.01); *H01L 43/10* (2013.01); *H01L 43/12* (2013.01); *H01L 45/04* (2013.01)

(56) References Cited

U.S. PATENT DOCUMENTS

| | | |
|---|---|---|
| 6,365,286 B1 | 4/2002 | Inomata et al. |
| 6,391,430 B1 | 5/2002 | Fullerton et al. |
| 6,479,353 B2 | 11/2002 | Bhattacharyya |
| 6,483,675 B1 | 11/2002 | Araki et al. |
| 6,713,830 B2 | 3/2004 | Nishimura et al. |
| 6,829,121 B2 | 12/2004 | Ikeda et al. |
| 6,895,658 B2 | 5/2005 | Shimazawa et al. |
| 6,965,138 B2 | 11/2005 | Nakajima et al. |
| 6,987,652 B2 | 1/2006 | Koganei |
| 7,220,601 B2 | 5/2007 | Hwang et al. |
| 7,586,781 B2 | 9/2009 | Saitoh et al. |
| 7,619,431 B2 | 11/2009 | De Wilde et al. |
| 7,746,603 B2 | 6/2010 | Gill |
| 7,768,824 B2 | 8/2010 | Yoshikawa et al. |
| 7,916,430 B2 | 3/2011 | Kagami et al. |
| 7,957,184 B2 | 6/2011 | Yoshikawa et al. |
| 8,119,018 B2 | 2/2012 | Ikemoto et al. |
| 8,130,474 B2 | 3/2012 | Childress et al. |
| 8,139,405 B2 | 3/2012 | Yoshikawa et al. |
| 8,154,915 B2 | 4/2012 | Yoshikawa et al. |
| 8,218,355 B2 | 7/2012 | Kitagawa et al. |
| 8,223,533 B2 | 7/2012 | Ozeki et al. |
| 8,268,713 B2 | 9/2012 | Yamagishi et al. |
| 8,270,125 B2 | 9/2012 | Gill |
| 8,339,841 B2 | 12/2012 | Iwayama et al. |
| 8,475,672 B2 | 7/2013 | Iori et al. |
| 8,710,605 B2 | 4/2014 | Takahashi et al. |
| 8,716,034 B2 | 5/2014 | Ohsawa et al. |
| 8,928,055 B2 * | 1/2015 | Saida et al. ................ 257/295 |
| 8,963,264 B2 | 2/2015 | Dimitrov et al. |
| 2001/0022742 A1 | 9/2001 | Bhattacharyya |
| 2001/0024347 A1 | 9/2001 | Shimazawa et al. |
| 2002/0070361 A1 | 6/2002 | Mack et al. |
| 2002/0146851 A1 | 10/2002 | Okazawa et al. |
| 2002/0167059 A1 | 11/2002 | Nishimura et al. |
| 2002/0182442 A1 | 12/2002 | Ikeda et al. |
| 2003/0067800 A1 | 4/2003 | Koganei |
| 2004/0080876 A1 | 4/2004 | Sugita et al. |
| 2004/0188732 A1 | 9/2004 | Fukuzumi |
| 2005/0020076 A1 | 1/2005 | Lee et al. |
| 2005/0048675 A1 | 3/2005 | Ikeda |
| 2005/0174876 A1 | 8/2005 | Katoh |
| 2005/0254289 A1 | 11/2005 | Nakajima et al. |
| 2005/0274997 A1 | 12/2005 | Gaidis et al. |
| 2006/0043317 A1 | 3/2006 | Ono et al. |
| 2006/0105570 A1 | 5/2006 | Hautala et al. |
| 2007/0164338 A1 | 7/2007 | Hwang et al. |
| 2008/0122005 A1 | 5/2008 | Horsky et al. |
| 2009/0080238 A1 | 3/2009 | Yoshikawa et al. |
| 2009/0191696 A1 | 7/2009 | Shao et al. |
| 2009/0243008 A1 | 10/2009 | Kitagawa et al. |
| 2009/0285013 A1 | 11/2009 | Saitoh et al. |
| 2010/0097846 A1 | 4/2010 | Sugiura et al. |
| 2010/0135068 A1 | 6/2010 | Ikarashi et al. |
| 2010/0183902 A1 | 7/2010 | Kim et al. |
| 2010/0230770 A1 | 9/2010 | Yoshikawa et al. |
| 2011/0037108 A1 | 2/2011 | Sugiura et al. |
| 2011/0059557 A1 | 3/2011 | Yamagishi et al. |
| 2011/0159316 A1 | 6/2011 | Wang et al. |
| 2011/0174770 A1 | 7/2011 | Hautala |
| 2011/0211389 A1 | 9/2011 | Yoshikawa et al. |
| 2011/0222335 A1 | 9/2011 | Yoshikawa et al. |
| 2011/0233697 A1 | 9/2011 | Kajiyama |
| 2012/0032288 A1 | 2/2012 | Tomioka |
| 2012/0056253 A1 | 3/2012 | Iwayama et al. |
| 2012/0074511 A1 | 3/2012 | Takahashi et al. |
| 2012/0135543 A1 | 5/2012 | Shin et al. |
| 2012/0139019 A1 | 6/2012 | Iba |
| 2012/0244639 A1 | 9/2012 | Ohsawa et al. |
| 2012/0244640 A1 | 9/2012 | Ohsawa et al. |
| 2013/0017626 A1 | 1/2013 | Tomioka |
| 2013/0069186 A1 | 3/2013 | Toko et al. |
| 2013/0099338 A1 | 4/2013 | Nakayama et al. |
| 2013/0181305 A1 | 7/2013 | Nakayama et al. |
| 2014/0327096 A1 * | 11/2014 | Guo ............................ 257/421 |
| 2014/0356979 A1 * | 12/2014 | Annunziata et al. ............. 438/3 |
| 2015/0069542 A1 * | 3/2015 | Nagamine et al. ............ 257/421 |

FOREIGN PATENT DOCUMENTS

| | | |
|---|---|---|
| JP | 2000156531 A | 6/2000 |
| JP | 2001052316 A | 2/2001 |
| JP | 2001308292 A | 11/2001 |
| JP | 2002176211 A | 6/2002 |
| JP | 2002280640 A | 9/2002 |
| JP | 2002299726 A | 10/2002 |
| JP | 2002299727 A | 10/2002 |
| JP | 2002305290 A | 10/2002 |
| JP | 2003110162 A | 4/2003 |
| JP | 2003536199 A | 12/2003 |
| JP | 2004006589 A | 1/2004 |
| JP | 2004500483 A | 1/2004 |
| JP | 2005209951 A | 8/2005 |
| JP | 2006005342 A | 1/2006 |
| JP | 2006510196 A | 3/2006 |
| JP | 2006165031 A | 6/2006 |
| JP | 2007053315 A | 3/2007 |
| JP | 2007234897 A | 9/2007 |
| JP | 2007305610 A | 11/2007 |
| JP | 2008066612 A | 3/2008 |
| JP | 2008522429 A | 6/2008 |
| JP | 2008153527 A | 7/2008 |
| JP | 2008171882 A | 7/2008 |
| JP | 2008193103 A | 8/2008 |
| JP | 2008282940 A | 11/2008 |
| JP | 2009054715 A | 3/2009 |
| JP | 2009081216 A | 4/2009 |
| JP | 2009239120 A | 10/2009 |
| JP | 2010003342 A | 1/2010 |
| JP | 2010113782 A | 5/2010 |
| JP | 2011040580 A | 2/2011 |
| JP | 2011054873 A | 3/2011 |
| JP | 2012244051 A | 12/2012 |
| JP | 2013153232 A | 8/2013 |
| WO | 2005088745 A1 | 9/2005 |

OTHER PUBLICATIONS

Related U.S. Appl. No. 13/226,960; First Named Inventor: Yuichi Ohsawa; Title: "Method of Manufacturing Multilayer Film"; filed Sep. 7, 2011.

Related U.S. Appl. No. 13/231,894; First Named Inventor: Shigeki Takahashi; Title: "Magnetic Memory and Method of Manufacturing the Same"; filed Sep. 13, 2011.

Related U.S. Appl. No. 13/604,537; First Named Inventor: Masahiko Nakayama; Title: "Magnetic Memory Element and Magnetic Memory"; filed Sep. 5, 2012.

Related U.S. Appl. No. 14/200,670; First Named Inventor: Kuniaki Sugiura; Title: "Magnetoresistive Element and Method of Manufacturing the Same"; filed Mar. 7, 2014.

(56) References Cited

OTHER PUBLICATIONS

Related U.S. Appl. No. 14/200,742; First Named Inventor: Masaru Toko; Title: "Magnetoresistive Element and Method for Manufacturing the Same"; filed Mar. 7, 2014.

Related U.S. Appl. No. 14/202,802; First Named Inventor: Masahiko Nakayama; Title: "Magnetoresistive Element and Method of Manufacturing the Same"; filed Mar. 10, 2014.

Albert, et al., "Spin-polarized current switching of a Co thin film nanomagnet", Applied Physics Letters, vol. 77, No. 23, Oct. 7, 2000, 3809-3811.

Otani, et al., "Microfabrication of Magnetic Tunnel Junctions Using CH3OH Etching", IEEE Transactions on Magnetics, vol. 43, No. 6, Jun. 6, 2007, 2776-2778.

U.S. Appl. No. 14/201,263; First Named Inventor: Masahiko Nakayama; Title: "Magnetic Memory and Method of Manufacturing the Same"; filed Mar. 7, 2014.

* cited by examiner

FIG. 4B    Parallel state (low resistance)

FIG. 4C    Antiparallel state (high resistance)

MAGNETIC MEMORY AND METHOD OF MANUFACTURING THE SAME

CROSS-REFERENCE TO RELATED APPLICATIONS

This application claims the benefit of U.S. Provisional Application No. 61/876,057, filed Sep. 10, 2013, the entire contents of which are incorporated herein by reference.

FIELD

Embodiments described herein relate generally to a magnetic memory and a method of manufacturing the same.

BACKGROUND

MRAM (Magnetic Random Access Memory) is a memory device using a storage element having a magnetoresistive effect for a memory cell that stores information. MRAM attracts attention as a next-generation memory device featuring the high-speed operation, large capacity, and non-volatility.

The magnetoresistive effect is a phenomenon in which electric resistance changes in accordance with the magnetization direction of a ferromagnetic substance. In MRAM, the magnetization direction of such a ferromagnetic substance is used to record information and information is read based on the magnitude of electric resistance corresponding thereto. Accordingly, MRAM can be caused to operate as a memory device.

In recent years, a ferromagnetic tunnel junction including two CoFeB ferromagnetic layers and an MgO tunnel barrier layer formed therebetween is used in a magnetoresistive effect element. In the ferromagnetic tunnel junction, a huge MR (Magnetic Resistance) ratio of 100% or more can be obtained due to the TMR (Tunnel Magnetic Resistance) effect. Thus, large-capacity MRAM using an MTJ (Magnetic Tunnel Junction) element making use of the TMR effect attracts expectations and attention as a magnetoresistive effect element.

When an MTJ element is used to MRAM, one of two ferromagnetic layers sandwiching the tunnel barrier layer therebetween is set as a reference layer in which the magnetization direction is invariable and the other is set as a storage layer in which the magnetization direction is variable. Information can be stored by associating a state in which the magnetization direction of the reference layer and the magnetization direction of the storage layer are parallel and a state in which both magnetization directions are antiparallel with "0" and "1". When compared with a case in which both magnetization directions are antiparallel, the resistance (barrier resistance) of the tunnel barrier layer is smaller and the tunnel current is larger when both magnetization directions are parallel.

DETAILED DESCRIPTION

In general, according to one embodiment, a magnetic memory includes a conductive layer containing a first metal material; a stacked body formed above the conductive layer, and comprising a first magnetization film containing a second metal material, a second magnetization film, and a tunnel barrier layer formed between the first magnetization film and the second magnetization film; and an insulating layer formed on a side face of the stacked body, and containing an oxide of the first metal material. The first magnetization film and/or the second magnetization film includes a first region positioned in a central portion, and a second region positioned in an edge portion and containing As, P, Ge, Ga, Sb, In, N, Ar, He, F, Cl, Br, I, Si, B, C, O, Zr, Tb, S, Se, or Ti.

In an MRAM manufacturing process, an MTJ film that shows the TMR effect is stacked on a conductive layer and this MTJ film is selectively etched to form an MTJ element. At this point, re-deposition of processing residue is occurred on the side face of the MTJ element. This processing residue is mainly re-deposited material of the conductive layer. If a conductive processing residue is re-deposited near the tunnel barrier layer on the side face of the MTJ element, a short fault occurs between upper and lower ferromagnetic layers of the tunnel barrier layer. If the short fault occurs, the amount of current passing between the upper and lower ferromagnetic layers without passing through the tunnel barrier layer increases. As a result, the ratio of resistance changes reflecting a difference of barrier resistance between the parallel state and the antiparallel state of the magnetization direction decreases, leading to a smaller MR ratio.

As a countermeasure to prevent the short fault due to the processing residue, it is considered to impart insulation properties to the re-deposition substance by oxidizing it. However, if a strong oxidation step is necessary to change the re-deposition substance into insulator, even the edge portion (side face portion) of the ferromagnetic layer is oxidized. Especially when portion near the interfaces between the tunnel barrier layer and the ferromagnetic layers (reference layer and storage layer) are oxidized, a problem such as a decrease in MR ratio or a decrease in switching energy barrier arises. In addition, if oxygen (O) is doped in the storage layer, the damping constant increases, i.e., a reversal current increases.

In an MRAM manufacturing process, an MTJ film having the TMR effect is stacked on a conductive layer, and an MTJ element is formed by selectively etching this MTJ film. In this process, re-deposition of the processing residue occurs on the side surfaces of the MTJ element. This processing residue is re-deposition of the material of the conductive layer. When re-deposition of the conductive processing residue occurs near a tunnel barrier layer on the side surfaces of the MTJ element, a shortcircuit occurs between ferromagnetic layers above and below the tunnel barrier layer. When a shortcircuit occurs, the amount of electric current that passes through the upper and lower ferromagnetic layers without passing through the tunnel barrier layer increases. Consequently, the ratio of a resistance change reflecting a barrier resistance difference between the parallel and antiparallel states of the magnetization directions decreases, and the MR ratio decreases.

To prevent the shortcircuit caused by the processing residue as described above, it is possible to give insulation properties to the re-deposit by oxidizing it. However, if a strong oxidation step is necessary to change the re-deposit into an insulator, even the edge portions (side-surface portions) of the ferromagnetic layers are oxidized. Especially, when portions near the interfaces between the tunnel barrier layer and the ferromagnetic layers (reference layer and storage layer) are oxidized, a problem such as a decrease in MR ratio or a decrease in switching energy barrier arises. Also, if oxygen (O) is doped in the storage layer, the damping constant increases, i.e., a reversal current increases in the storage layer.

It is proposed to constitute the conductive layer, which is to be a source of the re-deposition substance, by material easy to be oxidized (has a low standard electrode potential) for the problem. Thereby, the re-deposition substance can be insulator by a weak oxidation step. However, even if the re-deposition substance is changed into insulator by the weak oxidation step, it is still insufficient to solve the problem of oxidation damages which arises on the ferromagnetic layers described above.

By contrast, the present embodiment solves the above mentioned problem by ion-implanting impurities into the oxidation damage region.

The present embodiment will be explained below with reference to the accompanying drawings. In these drawings, the same reference numerals denote the same parts. In addition, a repetitive explanation will be made as needed.

<Embodiment>

An MRAM according to the present embodiment will be explained below with reference to FIG. 1 to FIG. 12. In the MRAM according to the present embodiment, oxidized regions 42B and 44B (oxidation damages) formed in the edge portions of a storage layer 42 and reference layer 44 in an oxidation step of a re-deposition substance are deactivated by ion implantation to form deactivated regions 42C and 44C. Thereby, a decrease in MR ratio, a decrease in switching energy barrier, or an increase in reversal current is suppressed. The present embodiment will be explained in detail below.

[Basic Configuration Example of MRAM According to Embodiment]

A basic configuration example of MRAM according to the first embodiment will be described using FIG. 1 to FIG. 4.

Figure 1:
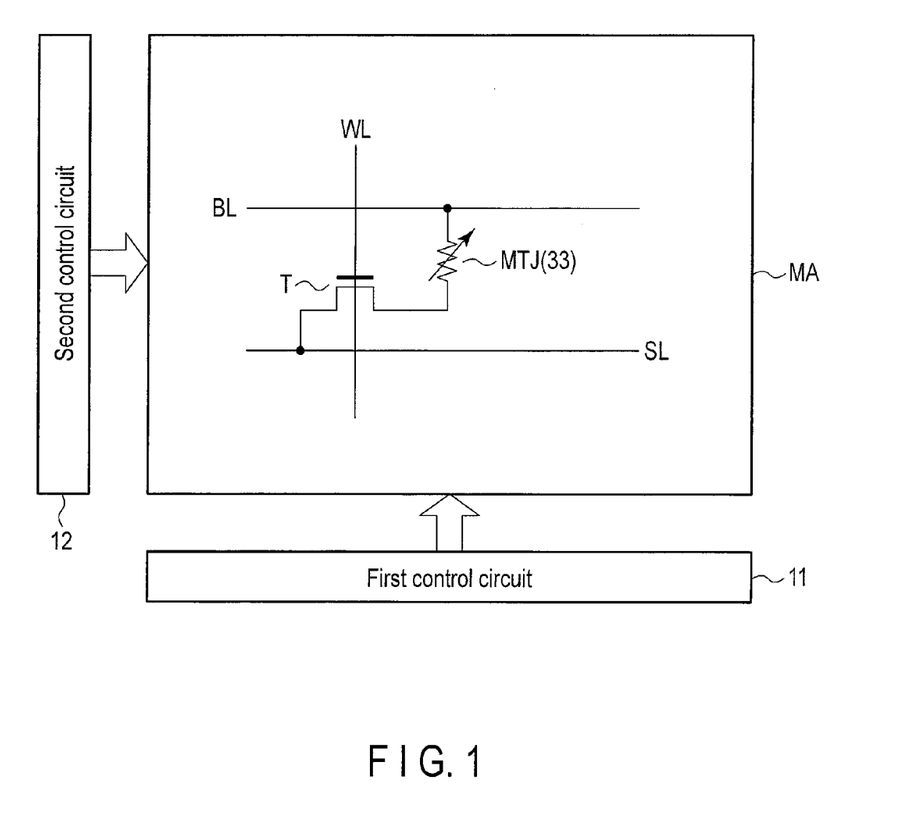
FIG. 1 is a circuit diagram showing a memory cell array of an MRAM according to an embodiment.

FIG. 1 is a circuit diagram showing a memory cell array of MRAM according to the first embodiment.

As shown in FIG. 1, a memory cell in a memory cell array MA comprises a serially connected body of a magnetoresistive effect element 33 and a switch element (for example, FET) T. One end of the serially connected body (one end of the magnetoresistive effect element 33) is electrically connected to a bit line BL and the other end (one end of the switch element T) of the serially connected body is electrically connected to a source line SL. A control terminal of the switch terminal T, for example, a gate electrode of FET is electrically connected to a word line WL.

The potential of the word line WL is controlled by a first control circuit 11. In addition, the potentials of the bit line BL and the source line SL are controlled by a second control circuit 12.

Figure 2:
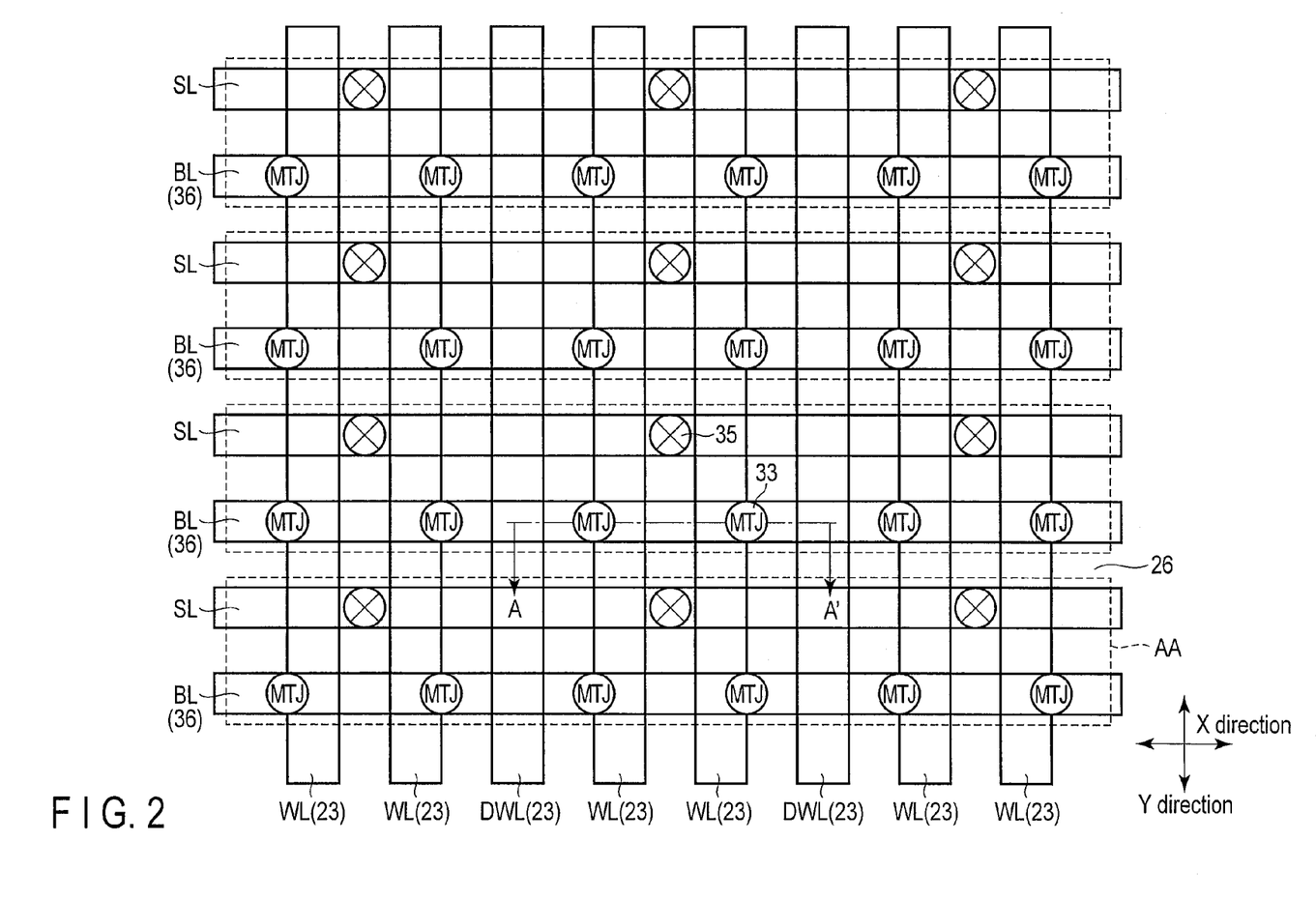
FIG. 2 is a plan view showing the memory cell array of the MRAM according to the embodiment.
Figure 3:
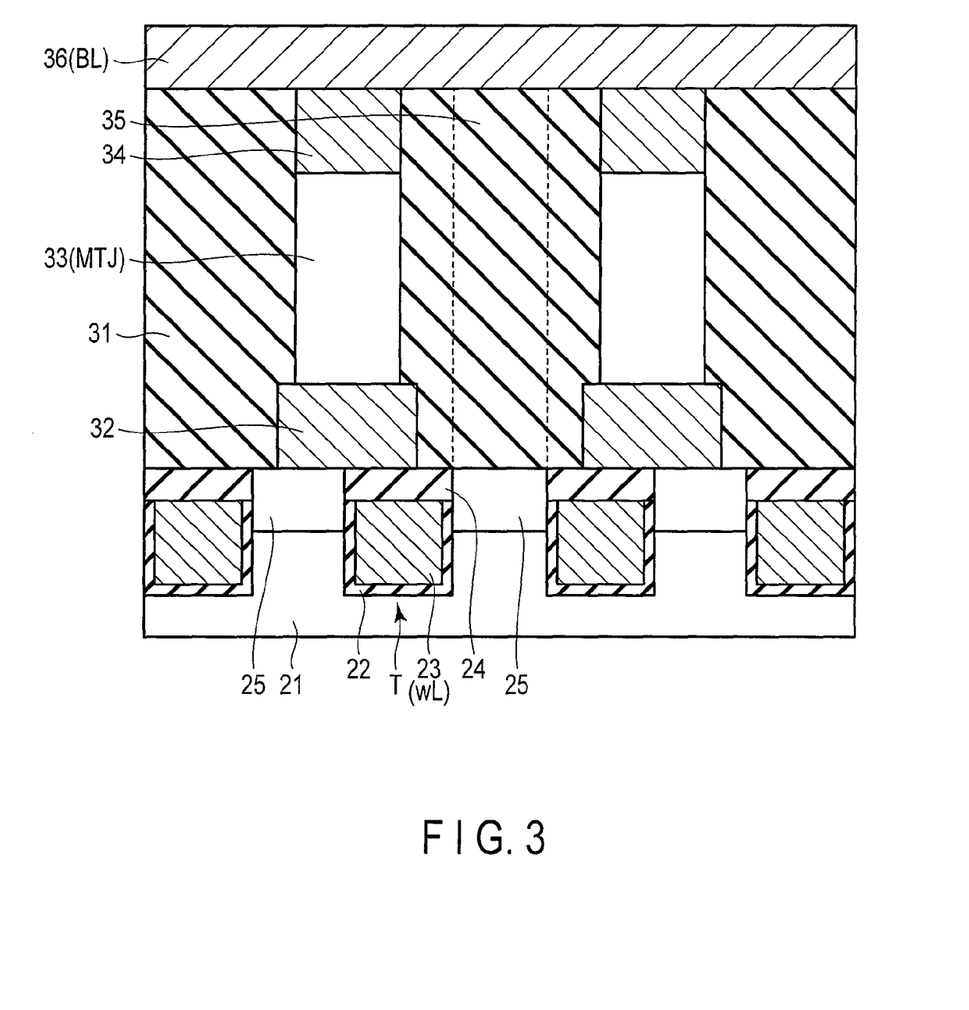
FIG. 3 is a sectional view taken along a line. A-A' in FIG. 2.

FIG. 2 is a plan view showing the memory cell array of MRAM according to the present embodiment. FIG. 3 is a sectional view along an A-A' line in FIG. 2. FIG. 3 also shows a cross section of a source line contact 35 together with the cross section of the magnetoresistive effect element 33.

As shown in FIG. 2, as an example, a plurality of word lines WL and a plurality of dummy word lines DWL extending in a Y direction and a plurality of bit lines BL and a plurality of source lines SL extending in an X direction perpendicular to the Y direction are arranged in the memory cell array MA. Two word lines WL and one dummy word line DWL are alternately arranged along the X direction. In addition, the bit line BL and the source line SL are alternately arranged along the Y direction.

Furthermore, a device isolation insulating layer extending in the X direction is provided in a surface region of a p-type semiconductor substrate (for example, a silicon substrate) 21 in the memory cell array MA and this region becomes an element isolation region 42. The surface region of the semiconductor substrate 21 in which the element isolation insulating layer is not provided becomes an active area AA. That is, the element isolation region 42 and the active area AA are alternately formed along the Y direction. The element isolation insulating layer is formed of, for example, STI (Shallow Trench Isolation). As the element isolation insulating layer, an insulating material having a high filling characteristic such as silicon nitride (SiN) is used.

As shown in FIG. 3, a select transistor using, for example, an n-channel MOSFET (Metal Oxide Semiconductor Field Effect Transistor) is provided on a semiconductor substrate 21 as the switch element T. The select transistor has a structure in which a recess is formed in the semiconductor substrate 21 and the gate electrode 23 containing, for example, polycrystalline silicon is embedded in this recess.

More specifically, a select transistor T includes a gate insulating layer 22, the gate electrode 23, and two diffusion layers 25 (a drain-side diffusion layer and a source-side diffusion layer).

The gate insulating layer 22 is formed on an inner surface on the lower side of a recess extending in the Y direction formed on the surface of the semiconductor substrate 21. The gate electrode 23 is formed on the inner surface of the gate insulating layer 22 like filling in the lower side of the recess. This gate electrode 23 corresponds to the word line WL. An insulating layer 24 made of, for example, SiN is formed on top surfaces of the gate insulating layer 22 and the gate electrode 23 like filling in an upper side of the recess. The top surface of the insulating layer 24 is approximately as high as the top surface (top surface of the diffusion layers 25 described later) of the semiconductor substrate 21.

The two diffusion layers 25 are formed in the surface of the semiconductor substrate 21 like sandwiching the gate insulating layer 22, the gate electrode 23, and the insulating layer 24 therebetween. The diffusion layers 25 positioned between two neighboring memory cells along the X direction are shared by the two neighboring memory cells. On the other hand, the diffusion layers 25 are isolated by the element isolation region 42 along the Y direction. In other words, the two diffusion layers 25 adjacent along the Y direction are adjacent via the element isolation region 42. That is, the diffusion layers 25 are positioned outside the formation region of the gate insulating layer 22, the gate electrode 23, and the insulating layer 24 in the active area AA. An interlayer dielectric layer 31 is formed on the semiconductor substrate 21 (on the insulating layer 24 and the diffusion layer 25).

A lower electrode 32, a magnetoresistive effect element 33, and an upper electrode 34 are formed in this order on one of the diffusion layers 25 (drain-side diffusion layer) inside the interlayer dielectric layer 31.

More specifically, the lower electrode 32 is formed so as to be in contact with a portion of the top surface of one of the diffusion layers 25 (drain-side diffusion layer) and a portion of the top surface of the insulating layer 24. In other words, the lower electrode 32 and the diffusion layer 25 partially overlap in a plane. This is because the processing method of the lower electrode 32 and that of the diffusion layer 25 (recess) are different. The plane shape of the interlayer dielectric layer 31 is, for example, square.

The magnetoresistive effect element 33 is formed so as to be in contact with the top surface of the lower electrode 32. The magnetoresistive effect element 33 has, for example, a circular plane shape and is formed in a cylindrical shape. In other words, the magnetoresistive effect element 33 and a lower electrode 49a overlap in a plane. It is desirable that the plane area of the magnetoresistive effect element 33 be smaller than the plane area of the lower electrode 32. Thereby, the whole bottom surface of the magnetoresistive effect element 33 can be in contact with the top surface of the lower electrode 32, and reducing the contact resistance thereof.

Figure 4A:
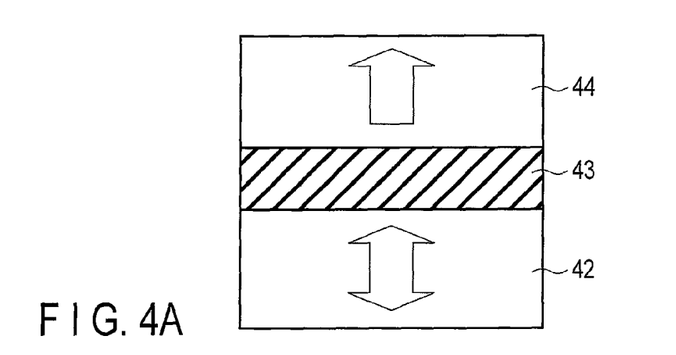
FIG. 4A is a sectional view showing an outline configuration of a magnetoresistive element.

FIG. 4A is a sectional view showing an outline configuration of a magnetoresistive effect element. Here, the storage layer 42, the tunnel barrier layer 43, and the reference layer 44 are mainly shown as the magnetoresistive effect element 33.

As shown in FIG. 4A, the magnetoresistive effect element 33 contains a stacked body comprising the storage layer 42 that is a ferromagnetic (may simply be called magnetic) layer (magnetization film), the reference layer 44 that is a ferromagnetic layer, and the tunnel barrier layer 43 that is a nonmagnetic layer formed therebetween.

The storage layer 42 is a ferromagnetic layer in which the magnetization direction is variable and has a perpendicular magnetic anisotropy that is perpendicular or approximately perpendicular to the film surface (top surface/bottom surface). Here, the magnetization direction is variable indicates that the magnetization direction changes for a predetermined write current. In addition, Being approximately perpendicular means that the direction of residual magnetization is in the range of $45° < \theta \leq 90°$ with respect to the film surface.

The tunnel barrier layer 43 is formed on the storage layer 42. The tunnel barrier layer 43 is a nonmagnetic layer and is formed of, for example, MgO.

The reference layer 44 is formed on the tunnel barrier layer 43. The reference layer 44 is a ferromagnetic layer in which the magnetization direction is invariable, and has a perpendicular magnetic anisotropy that is perpendicular or approximately perpendicular to the film surface. Here, the magnetization direction is invariable indicates that the magnetization direction does not change for a predetermined write current. That is, the reference layer 44 has a larger reversal energy barrier than the storage layer 42.

Figure 4B:
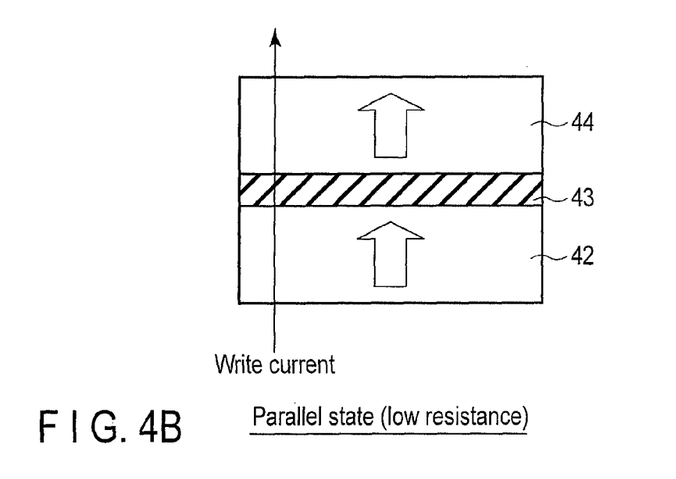
FIG. 4B is a view for explaining a write operation of the magnetoresistive element, and shows a sectional view of the magnetoresistive element in a parallel state.
Figure 4C:
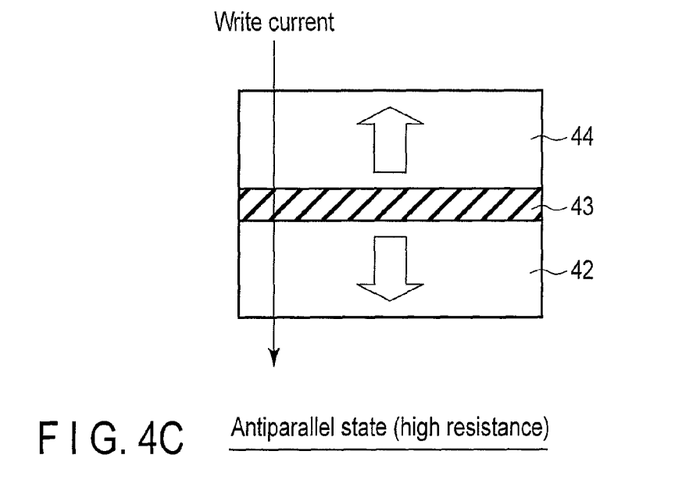
FIG. 4C is a view for explaining the write operation of the magnetoresistive element, and shows a sectional view of the magnetoresistive element in an antiparallel state.

FIG. 4B is a diagram illustrating a write operation of the magnetoresistive effect element and is a diagram showing a sectional view of the magnetoresistive effect element in a parallel state. FIG. 4C is a diagram illustrating the write operation of the magnetoresistive effect element and is a diagram showing a sectional view of the magnetoresistive effect element in an antiparallel state.

The magnetoresistive effect element 33 is, for example, a spin injection type magnetoresistive effect element. Thus, when data is written into the magnetoresistive effect element 33 or data is read from the magnetoresistive effect element 33, a current is passed to the magnetoresistive effect element 33 bidirectionally in a direction perpendicular to the film surface.

More specifically, data is written into the magnetoresistive effect element 33 as described below.

As shown In FIG. 4B, When a current flows from the lower electrode 32 to the upper electrode 34, that is, electrons (electrons from the reference layer 44 to the storage layer 42) are supplied from the side of the upper electrode 34, electrons spin-polarized in the same direction as the magnetization direction of the reference layer 44 are injected into the storage layer 42. In this case, the magnetization direction of the storage layer 42 is aligned with the same direction as the magnetization direction of the reference layer 44. Thereby, the magnetization direction of the reference layer 44 and the magnetization direction of the storage layer 42 are parallel arrays. In this parallel state, the value of resistance of the magnetoresistive effect element 33 is the smallest. This case is defined as, for example, data "0".

On the other hand, when, as shown in FIG. 4C, a current flows from the upper electrode 34 to the lower electrode 32, that is, when electrons (electrons from the storage layer 42 to the reference layer 44) are supplied from the side of the lower electrode 32, electrons spin-polarized in a direction opposite to the magnetization direction of the reference layer 44 injected into the storage layer 42 due to being reflected by the reference layer 44. Thereby, the magnetization direction of the reference layer 44 and the magnetization direction of the storage layer 42 are antiparallel arrays. In this antiparallel state, the value of resistance of the magnetoresistive effect element 33 is the largest. This case is defined as, for example, data "1".

In addition, data is read from the magnetoresistive effect element 33 as described below.

A read current is supplied to the magnetoresistive effect element 33. This read current is set to a value (value smaller than the write current) at which the magnetization direction of the storage layer 42 is not reversed. The data "0" or "1" can be read by detecting changes of the value of resistance of the magnetoresistive effect element 33 at this point.

As shown in FIG. 3, the upper electrode 34 is formed so as to be in contact with the top surface of the magnetoresistive effect element 33. The bit line BL is formed on the upper electrode 34 so as to be in contact therewith. That is, the upper electrode 34 is a bit line contact.

In addition, a source line contact 35 is formed inside the interlayer dielectric layer 31 on the other diffusion layer 25 (source-side diffusion layer). The source line contact 35 is formed so as to be in contact with the top surface of the other diffusion layer 25. The source line SL is formed on this source line contact 35 so as to be in contact therewith. The other diffusion layer 25 and the source line contact 35 are shared by two neighboring memory cells.

Among the three gate electrodes 23 adjacent in the X direction, the two gate electrodes 23 are electrically connected to the magnetoresistive effect element 33 and correspond to the word like WL, and the one gate electrode 23 is not electrically connected to the magnetoresistive effect element 33 and corresponds to the dummy word line DWL.

[Configuration of the Magnetoresistive Effect Element According to the Embodiment]

The configuration of the magnetoresistive effect element 33 according to the present embodiment will be described using FIG. 5.

Figure 5:
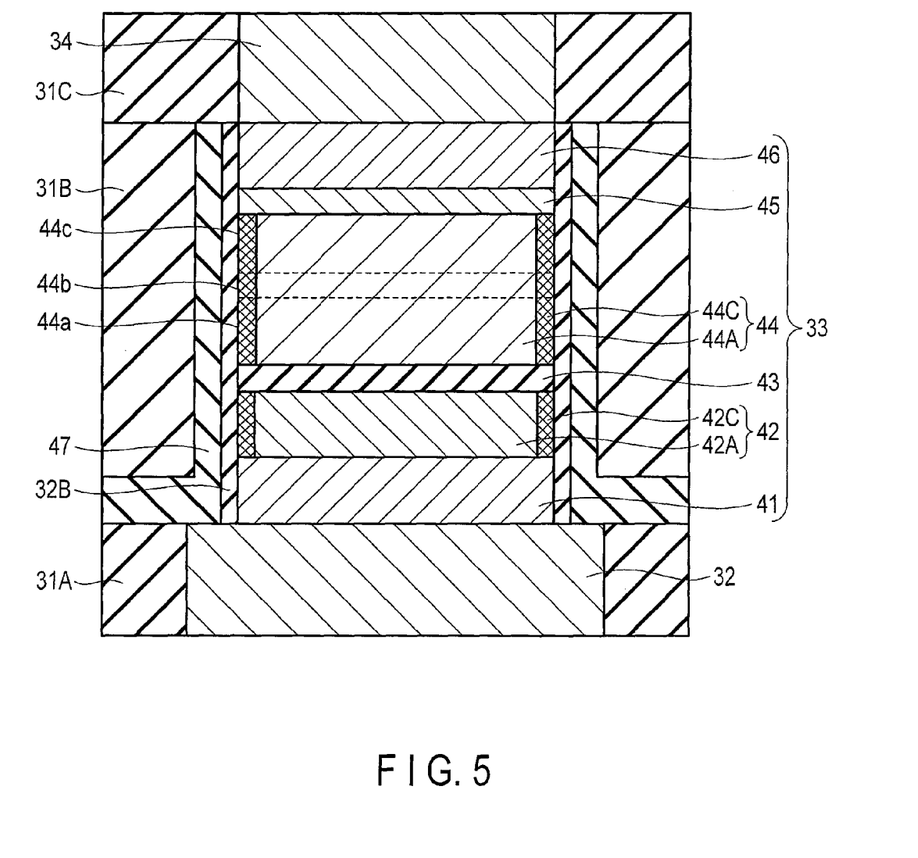
FIG. 5 is a sectional view showing a configuration of the magnetoresistive element according to the embodiment.

FIG. 5 is a sectional view showing the configuration of the magnetoresistive effect element according to the present embodiment. Here, in addition to the magnetoresistive effect element 33, the lower electrode 32 positioned below the magnetoresistive effect element 33 and the upper electrode 34 positioned above the magnetoresistive effect element 33 are also shown.

As shown in FIG. 5, MRAM comprises the lower electrode 32, the upper electrode 34, and the magnetoresistive effect element 33. The lower electrode 32 is formed in an interlayer dielectric layer 31A and the upper electrode 34 is formed in an interlayer dielectric layer 31C. The magnetoresistive effect element 33 is formed between the lower electrode 32 and the upper electrode 34, and an interlayer dielectric layer 32B is formed between the neighboring magnetoresistive effect elements 33.

The lower electrode 32 comprises a conductive layer containing a first metal material having a standard electrode potential lower than that of a second metal material (e.g., Co and Fe) contained in the storage layer 42 and/or reference layer 44. When the storage layer 42 and/or reference layer 44 comprises CoFeB, the lower electrode 32 contains the first metal material having a standard electrode potential lower than that of Fe having the lowest standard electrode potential in CoFeB. That is, the standard electrode potential of the first metal material is lower than the standard electrode potential (−0.447 V) of Fe, and desirably lower than −0.8 V. For this reason, the first metal material is a material that is more easily oxidized than Fe. The first metal material as described above contains one of Ta, Zn, Cr, Nb, V, Mn, Zr, Pa, Hf, Ti, Al, Be, Sc, Nd, Gd, Tb, Iu, and Dv, or an alloy containing two or more thereof.

The magnetoresistive effect element 33 comprises the underlying layer 41, the storage layer 42, the tunnel barrier layer 43, the reference layer 44, an intermediate layer 45, and a shift cancelling layer 46.

The underlying layer 41 is formed on the lower electrode 32. Like the lower electrode 32, the underlying layer 41 comprises a conductive layer containing the first metal material having a standard electrode potential lower than that of the second metal material (e.g., Co and Fe) contained in the storage layer 42 and reference layer 44. When the storage layer 42 and reference layer 44 comprises CoFeB, the underlying layer 41 contains the first metal material having a standard electrode potential lower than that of Fe having the lowest standard electrode potential in CoFeB.

It is noted that at least one of the underlying layer 41 and lower electrode 32 may comprise the first metal material. Especially when the underlying layer 41 is etched halfway in a step (shown in FIG. 8) of processing the magnetoresistive element 33 during the manufacturing process (to be described later), at least the underlying layer 41 desirably comprises the first metal material.

The storage layer 42 is formed on the underlying layer 41. The storage layer 42 contains a ferromagnetic material like, for example, Co and Fe (second metallic material). In addition, B is added to the ferromagnetic material for the purpose of adjusting saturation magnetization or crystal magnetic anisotropy. That is, the storage layer 42 comprises a compound, for example, CoFeB or the like.

In addition, the storage layer 42 includes an active region 42A of the central portion, and a deactivated region 42C of the edge portion. In other words, the active region 42A is formed as the inside of the storage layer 42, and the deactivated region 42C is formed as the outside of the storage layer 42.

The active region 42A contains a compound such as CoFeB, and has magnetization. The deactivated region 42C contains a compound such as CoFeB, O, and As, and has no magnetization. "Has no magnetization" herein mentioned includes "has substantially no magnetization". The deactivated region 42C has no magnetization because it contains As in addition to a compound such as CoFeB and O. It is noted that the deactivated region 42C may contain P, Ge, Ga, Sb, In, N, Ar, He, F, Cl, Br, I, Si, B, C, Zr, Tb, S, Se, or Ti, instead of As, so as to have no magnetization.

The tunnel barrier layer 43 is formed on the storage layer 42. The tunnel barrier layer 43 contains a nonmagnetic material, for example, MgO or the like. However, the present embodiment is not limited to such an example and the tunnel barrier layer 43 may contain metallic oxide such as $Al_2O_3$, MgAlO, ZnO, or TiO.

The reference layer 44 is formed on the tunnel barrier layer 43. The reference layer 44 comprises, for example, a laminated structure of a first magnetic layer 44a, a nonmagnetic layer 44b, and a second magnetic layer 44c sequentially formed from the side of the tunnel barrier layer.

The first magnetic layer 44a contains a ferromagnetic material like, for example, Co and Fe (second metallic material). B is added to the ferromagnetic material for the purpose of adjusting saturation magnetization or crystal magnetic anisotropy. That is, the first magnetic layer 44a is formed of, for example, a compound such as CoFeB same as the storage layer 42. The first magnetic layer 44a is a layer contributing to the MR ratio. The nonmagnetic layer 44b is formed between the first magnetic layer 44a and the second magnetic layer 44c. The nonmagnetic layer 44b contains a nonmagnetic material like Ta, W, or Hf. The second magnetic layer 44c contains a ferromagnetic material and a nonmagnetic material. For example, Pt can be cited as the nonmagnetic material. As the ferromagnetic material, for example, Co is contained as a ferromagnetic material. That is, the second magnetic layer 44c comprises a stacked film, for example, a Pt layer and a Co layer. This stacked film comprises a plurality of Pt layers and a plurality of Co layers being alternately stacked. The second magnetic layer 44c contributes to perpendicular magnetic anisotropy.

In addition, the reference layer 44 includes an active region 44A of the central portion, and the deactivated region 44C of the edge portion. In other words, the active region 44A is formed as the inside of the reference layer 44, and the deactivated region 44C is formed as the outside of the reference layer 44. That is, the reference layer 44 includes the active region 44A of the central portion and the deactivated region 44C of the edge portion, in each of the first magnetic layer 44a, nonmagnetic layer 44b, and second magnetic layer 44c.

The active region 44A contains, for example, a compound such as CoFeB in the first magnetic layer 44a, and contains, for example, Ta, W, Hf, or the like in the nonmagnetic layer 44b, and contains the laminated film including Pt layers and Co layers in the second magnetic layer 44c. The active region 44A has magnetization as the integration of the first magnetic layer 44a, nonmagnetic layer 44b, and second magnetic layer 44c.

The deactivated region 44C contains, for example, a compound such as CoFeB, O, and As in the first magnetic layer 44a, and contains, for example, Ta, W, Hf or the like, O, and As in the nonmagnetic layer 44b, and contains a laminated film of Pt and Co, O, and As in the second magnetic layer 44c. The deactivated region 44C has no magnetization as the integration of the first magnetic layer 44a, nonmagnetic layer 44b, and second magnetic layer 44c. It is noted that the deactivated region 44C may contain P, Ge, Ga, Sb, In, N, Ar, He, F, Cl, Br, I, Si, B, C, Zr, Tb, S, Se, or Ti, instead of As, so as to have no magnetization.

The shift cancelling layer 46 is formed on the reference layer 44 via the intermediate layer 45. The intermediate layer 45 contains, for example, a nonmagnetic material having electric conductivity such as Ru. The shift cancelling layer 46 is a magnetic layer in which the magnetization direction is invariable and has a perpendicular magnetic anisotropy that is perpendicular or approximately perpendicular to the film surface. In addition, the magnetization direction thereof is a direction opposite to the magnetization direction of the reference layer 44. Thereby, the shift cancelling layer 46 can cancel out, a leakage magnetic field from the reference layer 44, which is applied to the storage layer 42. In other words, the shift cancelling layer 46 has an effect of adjusting, an offset of reversal characteristics for the storage layer 42 due to the leakage magnetic field from the reference layer 44, to the opposite direction. This shift cancelling layer 46 comprises, for example, an artificial lattice having a stacked structure of a ferromagnetic material like such as Ni, Fe, or Co and a nonmagnetic material such as Cu, Pd, or Pt. The upper electrode 34 is formed on the shift cancelling layer 46.

In addition, the plane shape of the underlying layer 41, the storage layer 42, the tunnel barrier layer 43, the reference layer 44, the intermediate layer 45, and the shift cancelling layer 46 is, for example, circular. Thus, the magnetoresistive effect element 33 is formed in a pillar shape. However, the present embodiment is not limited to such an example and the plane shape of the magnetoresistive effect element 33 may be square, rectangular, or elliptic.

In addition, the storage layer 42 and the reference layer 43 may have dimensional differences in a plane. For example, the diameter of the reference layer 44 in a plane may be smaller than the diameter of the storage layer 42. Moreover, an insulating layer having dimensional differences from the storage layer 42 may be formed as a sidewall of the reference layer 44. Thereby, an electric short between the storage layer 42 and the reference layer 44 can be prevented.

In addition, the order of arrangement may be reversed in the configuration of the magnetoresistive effect element 33. That is, the shift cancelling layer 46, the intermediate layer 45, the reference layer 44, the tunnel barrier layer 43, the storage layer 42, and the underlying layer 41 may be sequentially formed on the lower electrode 32.

The insulating layer 32B is formed on the side face (perimeter) of the magnetoresistive effect element 33. This insulating layer 32B is obtained by oxidizing processing residue of the lower electrode 32 or the underlying layer 41. More specifically, the insulating layer 32B is obtained by oxidizing the re-deposition substance formed by processing the surface of the lower electrode 32 or underlying layer 41 at the time of processing the magnetoresistive effect element 33. That is, the insulating layer 32B is an oxide of the first metallic material contained in the lower electrode 32.

An insulating layer 47 comprising, for example, SiN, SiOX, MgO, or AlOX is formed on the side face of the insulating layer 32B. The insulating layer 47 functions as a protective layer of the magnetoresistive effect element 33.

[Method of Manufacturing Magnetoresistive Element According to Embodiment]

The method of manufacturing the magnetoresistive effect element 33 according to the present embodiment will be described using FIG. 6 to FIG. 11.

FIG. 6 to FIG. 11 are sectional views showing manufacturing steps of the magnetoresistive effect element according to the present embodiment.

Figure 6:
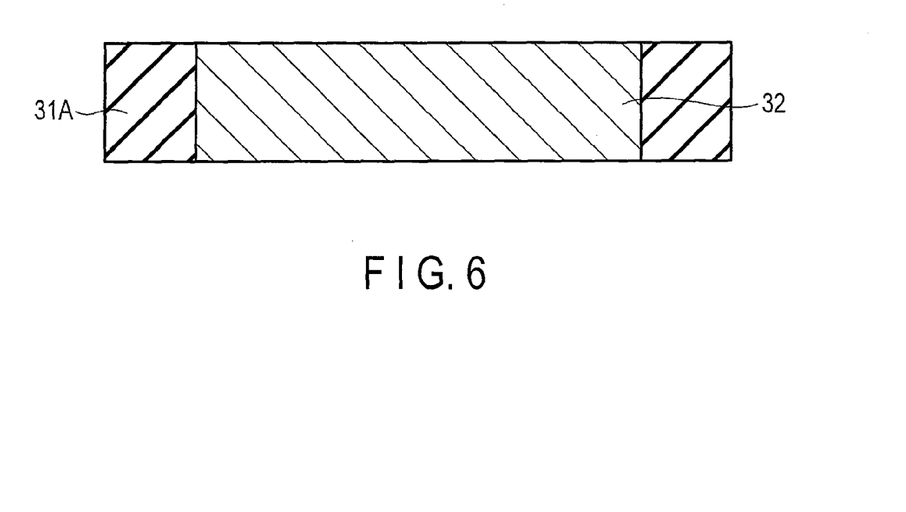
FIGS. 6, 7, 8, 9, 10, and 11 are sectional views showing a manufacturing steps of the magnetoresistive element according to the embodiment.

First, as shown in FIG. 6, the interlayer dielectric layer 31A containing, for example, SiOX is formed on the semiconductor substrate 21 by, for example, CVD method. Next, a hole not shown reaching the semiconductor substrate 21 is formed in the interlayer dielectric layer 31A by, for example, lithography technology.

Next, the lower electrode 32 is formed in the hole of the interlayer dielectric layer 31A by, for example, CVD method. The lower electrode 32 comprises a conductive layer containing a first metal material having a standard electrode potential lower than that of a second metal material (e.g., Co and Fe) contained in the storage layer 42 and/or reference layer 44. When the storage layer 42 and/or reference layer 44 comprise CoFeB, the lower electrode 32 contains the first metal material having a standard electrode potential lower than that of Fe having the lowest standard electrode potential in CoFeB. The first metal material contains one of Ta, Zn, Cr, Nb, V, Mn, Zr, Pa, Hf, Ti, Al, Be, Sc, Nd, Gd, Tb, Iu, and Dv, or an alloy containing two or more thereof.

Figure 7:
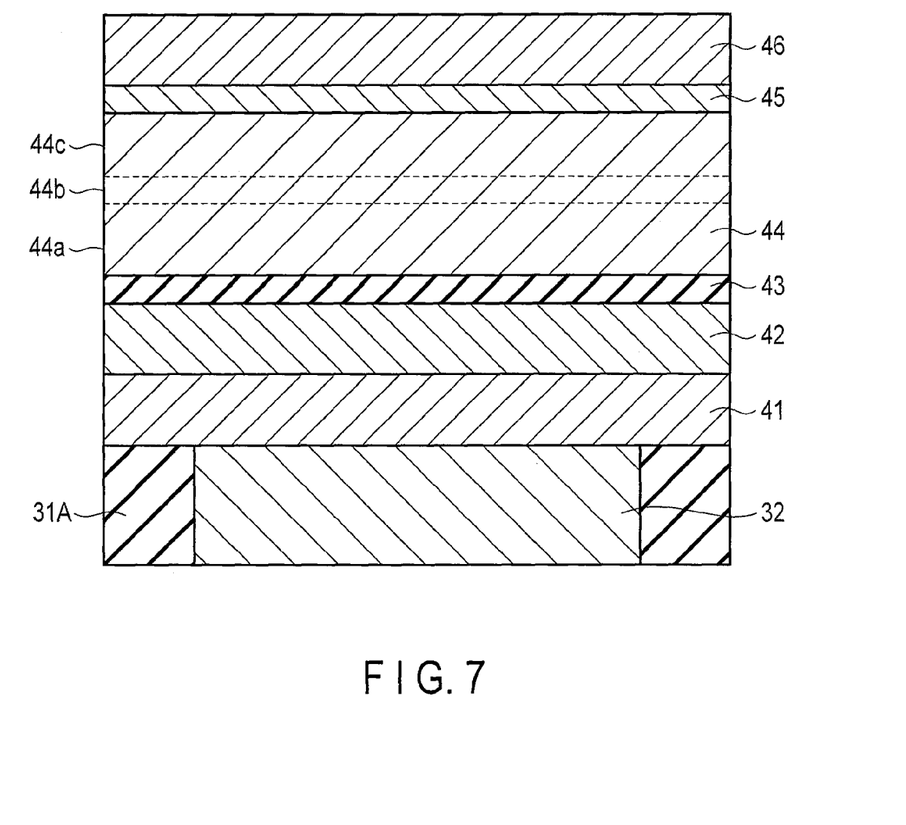

Next, as shown in FIG. 7, the underlying layer 41 is formed on the lower electrode 32 and the interlayer dielectric layer 31A by, for example, sputtering method. When the storage layer 42 and the reference layer 44 comprise CoFeB, the underlying layer 41 contains the first metallic material having a standard electrode potential smaller than that of Fe having the smallest standard electrode potential.

Next, the storage layer 42 is formed on the underlying layer 41 by, for example, sputtering method. The storage layer 42 contains, for example, a ferromagnetic material such as Co and Fe (second metallic material). In addition, B is added to the ferromagnetic material for the purpose of adjusting saturation magnetization or crystal magnetic anisotropy. That is, the storage layer 42 comprises, for example, a compound such as CoFeB.

Next, the tunnel barrier layer 43 is formed on the storage layer 42. The tunnel barrier layer 43 contains, for example, a nonmagnetic material such as MgO. The MgO layer constituting the tunnel barrier layer 43 may be formed by a direct film formation of MgO layer by sputtering method targeting MgO. Moreover, the MgO layer may be formed by forming an Mg layer by sputtering method targeting Mg and then oxidizing the Mg layer. As an oxidation method of the Mg layer, oxidation by oxygen gas, oxygen plasma, oxygen radical, or ozone is given. To improve the MR ratio, it is desirable to directly form the MgO layer by the sputtering method targeting MgO. In addition, the MgO layer may be formed by MBE (Molecular Beam Epitaxy) method, the ALD (Atomic Layer Deposition) method, or the CVD method.

Next, the reference layer 44 is formed on the tunnel barrier layer 43 by, for example, sputtering method. The reference layer 44 comprises, for example, a stacked structure of a first magnetic layer, a nonmagnetic layer, and a second magnetic layer formed from the side of the tunnel barrier layer.

The first magnetic layer 44a contains, for example, a ferromagnetic material such as Co and Fe (second metallic material). In addition, B is added to the ferromagnetic material for the purpose of adjusting saturation magnetization or crystal magnetic anisotropy. That is, the first magnetic layer 44a comprises, for example, a compound such as CoFeB same as the storage layer 42. The first magnetic layer 44a is a layer contributing to the MR ratio. The nonmagnetic layer 44b is formed between the first magnetic layer 44a and the second magnetic layer 44c. The nonmagnetic layer 44b contains a nonmagnetic material such as Ta, W, or Hf. The second magnetic layer 44c contains a ferromagnetic material and a nonmagnetic material. For example, Pt can be cited as the nonmagnetic material. As the ferromagnetic material, for example, Co is contained as a ferromagnetic material. That is, the second magnetic layer 44c comprises, for example, a stacked film of a Pt layer and a Co layer. This stacked film comprises a plurality of Pt layers and a plurality of Co layers being alternately stacked. The second magnetic layer 44c contributes to perpendicular magnetic anisotropy. The second magnetic layer 44c as described above is formed by changing the target in the sputtering method.

Next, the intermediate layer 45 made of Ru is formed on the reference layer 44 by, for example, sputtering method, and the shift cancelling layer 46 is formed on this intermediate layer 45 by, for example, sputtering method. The shift cancelling layer 46 comprises an artificial lattice having a stacked structure of a ferromagnetic material like such as Ni, Fe, or Co and a nonmagnetic material such as Cu, Pd, or Pt.

Thereafter, each layer of the magnetoresistive effect element 33 is crystallized by performing annealing.

Figure 8:
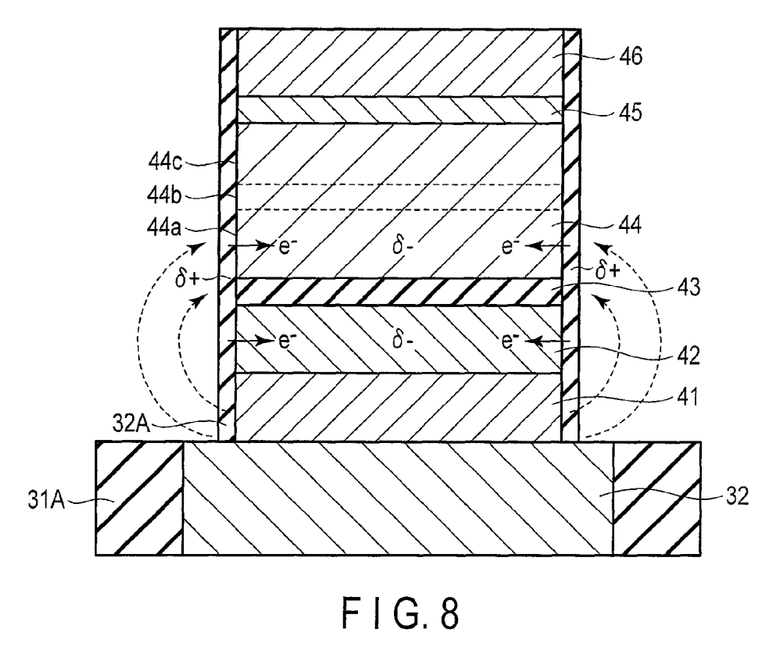

Next, as shown in FIG. 8, a hard mask not shown is formed on the shift cancelling layer 46 and is patterned so that the plane shape thereof is, for example, circular. The hard mask comprises a metallic material having electric conductivity, for example, comprises TiN. The metallic material is not limited to the above example and the hard mask may comprise a film containing one of Ti, Ta, and W or a stacked film thereof. Thereby, the hard mask does not need to be removed later and can be used as a contact portion for the upper electrode 34.

Next, the shift cancelling layer 46, the intermediate layer 45, the reference layer 44, the tunnel barrier layer 43, the storage layer 42, and the underlying layer 41 are processed by physical etching such as ion milling method using the hard mask as a mask. Thereby, the shift cancelling layer 46, the intermediate layer 45, the reference layer 44, the tunnel barrier layer 43, the storage layer 42, and the underlying layer 41 are patterned in the same manner as the hard mask and the plane shape thereof becomes circular.

At this time, down to the surface of the lower electrode 32 is processed. Thereby, the first metallic material contained in the lower electrode 32 or underlying layer 41 is re-deposited on the side face of the magnetoresistive effect element 33, so that the conductive layer 32A is formed. Therefore, the conductive layer 32A contains the first metallic material having a standard electrode potential smaller than that of Fe having the smallest standard electrode potential among CoFeB contained in the storage layer 42 and the reference layer 44. Then, electrons move from the conductive layer 32A to the storage layer 42 and the reference layer 44. As a result, the storage layer 42 and the reference layer 44 are charged at δ+ and the conductive layer 32A is charged at δ+.

Figure 9:
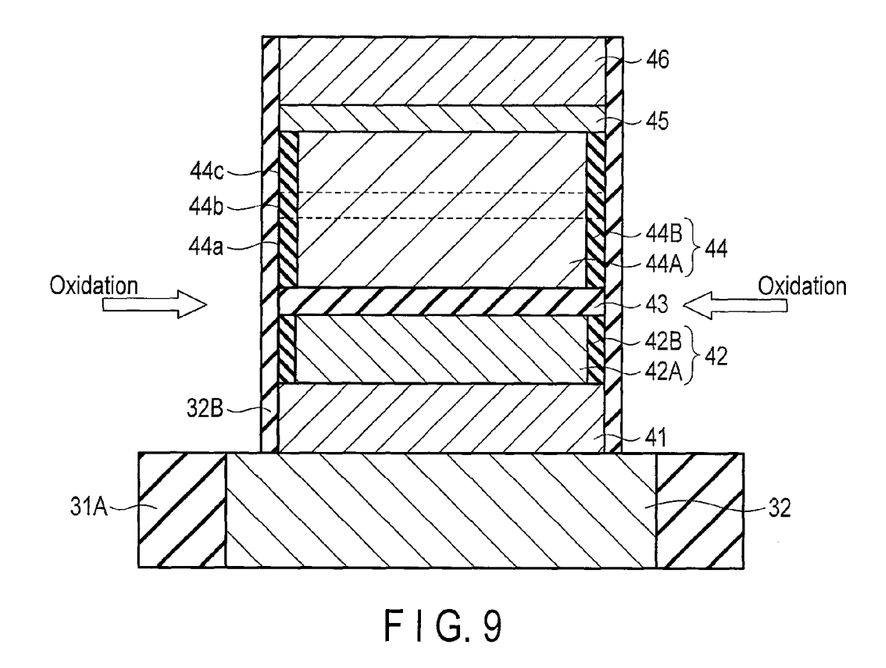

Next, as shown in FIG. 9, the conductive layer 32A is oxidized by one of various oxidation methods to form an insulating layer 32B. Thus, the insulating layer 32B is an oxide of the first metallic material contained in the lower electrode 32 or the underlying layer. Oxidation by an oxygen gas, oxygen plasma, oxygen radical, or ozone can be cited as the oxidation method. At this point, the storage layer 42 and the reference layer 44 are charged at δ+ and the conductive layer 32A is charged at δ+ and thus, the conductive layer 32A is more likely to be oxidized than the storage layer 42 and the reference layer 44. Therefore, the conductive layer 32A can be oxidized even by weak oxidation.

At this time, the edge portions of the storage layer 42 and reference layer 44 are also oxidized.

Thereby, the active region 42A of the central portion and the oxidized region 42B of the edge portion are formed in the storage layer 42. The active region 42A contains, for example, a compound such as CoFeB, and has magnetization. The oxidized region 42B, for example, contains a compound such as CoFeB and O, and has magnetization smaller than that of the active region 42A.

In addition, the active region 44A of the central portion and the oxidized region 44B of the edge portion are formed in the reference layer 44. The active region 44A contains, for example, a compound such as CoFeB in the first magnetic layer 44a, and contains, for example, Ta, W, Hf, or the like in the nonmagnetic layer 44b, and contains a laminated film of a Pt layer and a Co layer in the second magnetic layer 44c. The active region 44A has magnetization as the integration of the first magnetic layer 44a, nonmagnetic layer 44b, and second magnetic layer 44c. The oxidized region 44B contains, for example, a compound such as CoFeB and O in the first magnetic layer 44a, and contains, for example, Ta, W, Hf, or the like and O in the nonmagnetic layer 44b, and contains a laminated film of a Pt layer and a Co layer, and O in the second magnetic layer 44c. The oxidized region 44B has magnetization smaller than that of the active region 44A as the integration of the first magnetic layer 44a, nonmagnetic layer 44b, and second magnetic layer 44c.

Figure 10:
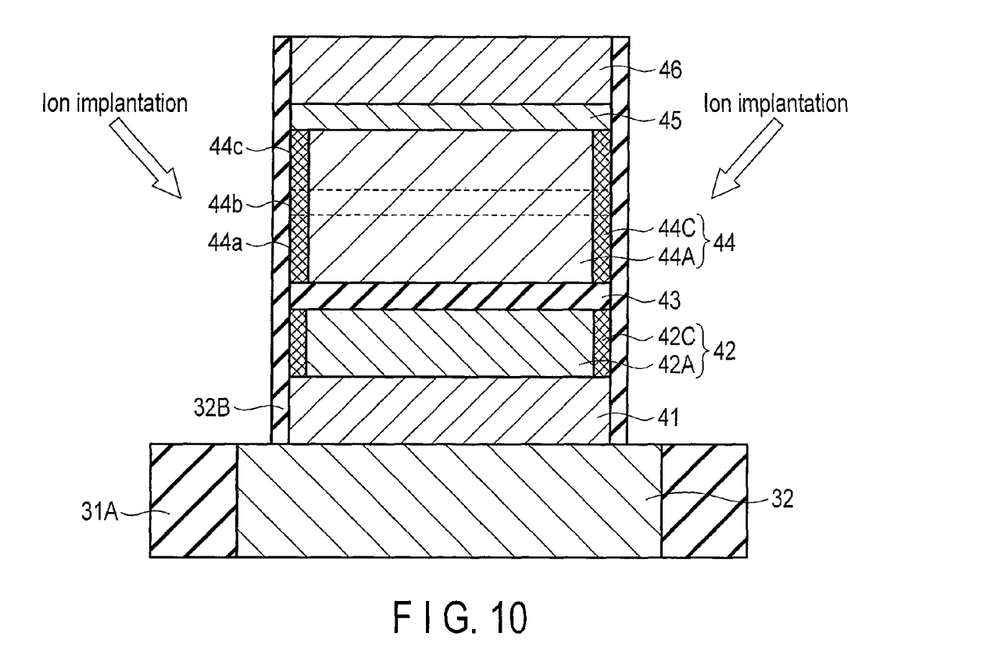

Next, as shown in FIG. 10, As is doped into the oxidized regions 42B and 44B by ion implantation.

Thereby, a deactivated region 42C is formed in the oxidized region 42B of the storage layer 42. The deactivated region 42C contains, for example, a compound such as CoFeB, O, and As, and has no magnetization.

In addition, a deactivated region 44C is formed in the oxidized region 44B of the reference layer 44. The deactivated region 44C contains, for example, a compound such as CoFeB, O and As in the first magnetic layer 44a, and contains Ta, W, Hf, or the like, O, and As in the nonmagnetic layer 44b, and contains a laminated film of a Pt layer and a Co layer, O, and As in the second magnetic layer 44c. The deactivated region 44C has no magnetization as the integration of the first magnetic layer 44a, nonmagnetic layer 44b, and second magnetic layer 44c.

It is noted that the deactivated regions 42C and 44C may have no magnetization by ion implanting of P, Ge, Ga, Sb, In, N, Ar, He, F, Cl, Br, I, Si, B, C, O, Zr, Tb, S, Se, or Ti, instead of As.

Figure 11:
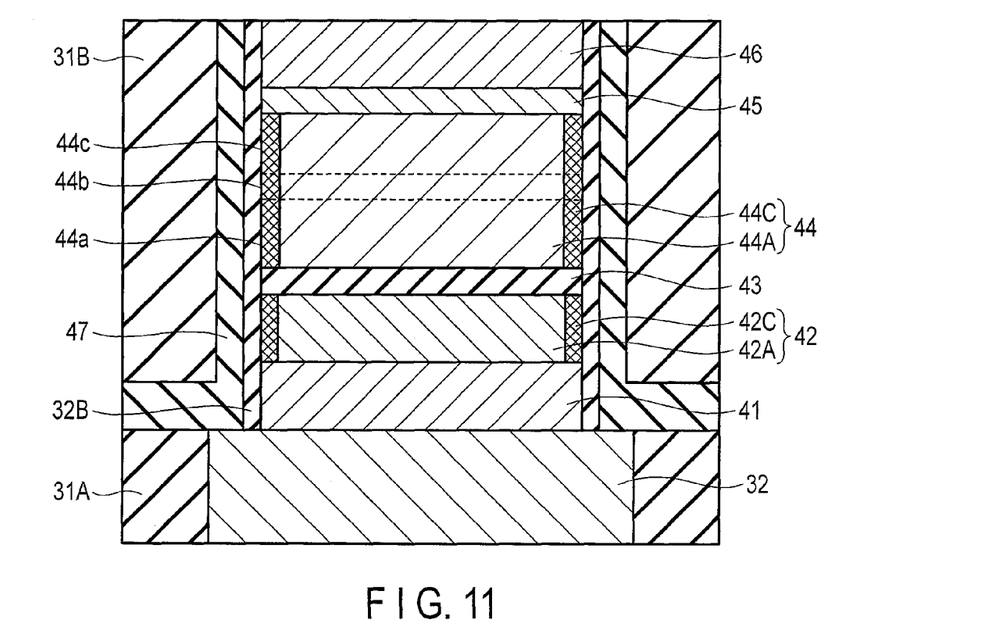

Next, as shown in FIG. 11, the insulating layer 47 comprising, for example, SiN, $SiO_x$, MgO, or AlOX is formed by, for example, sputtering method, CVD method, or ALD method. The insulating layer 47 functions as a protective layer of the magnetoresistive effect element 33 in the next step.

Next, an interlayer dielectric layer 31B containing, for example, SiOX is formed on the entire surface by, for example, CVD method. Thereby, the interlayer dielectric layer 31B is embedded between the neighboring magnetoresistive effect elements 33. Thereafter, the interlayer dielectric layer 31B formed on the magnetoresistive effect elements 33 is etched back after being planarized. Thereby, the top surface of the magnetoresistive effect elements 33 is exposed.

Next, as shown in FIG. 5, the interlayer dielectric layer 31C containing, for example, $SiO_x$ is formed on the magnetoresistive effect elements 33 and the interlayer dielectric layer 31B. Next, a hole not shown reaching the magnetoresistive effect elements 33 is formed in the interlayer dielectric layer 31A by, for example, lithography technology. Thereafter, the upper electrode 34 is formed in the hole by, for example, CVD method and electrically connected to the magnetoresistive effect elements 33.

In this manner, the magnetoresistive effect elements 33 according to the present embodiment are formed.

[Effects of Embodiment]

According to the above-mentioned embodiment, in the edge portions of the storage layer 42 and reference layer 44, the oxidized regions 42B and 44B (oxidation damages) which are formed along with the oxidation step of the re-deposition substance, are deactivated by ion implantation. Thereby, the deactivated region 42C in which, for example, As is implanted and which has no magnetization is formed in the edge portion of the storage layer 42, and the deactivated region 44C in which, for example, As is implanted and which has no magnetization is formed in the edge portion of the reference layer 44. Thereby, the following effects can be obtained.

The oxidized regions 42B and 44B which are formed along with the oxidation step of the re-deposition substance, have magnetization smaller than that of the active regions 42A and 44A. However, when O is introduced by the oxidation of the storage layer 42 and the reference layer 44, the magnetic characteristics thereof become unstable. Therefore, the magnetic characteristics of the storage layer 42 and the reference layer 44 are deteriorated by the influence of the unstable magnetic characteristics of the oxidized regions 42B and 44B.

Figure 12:
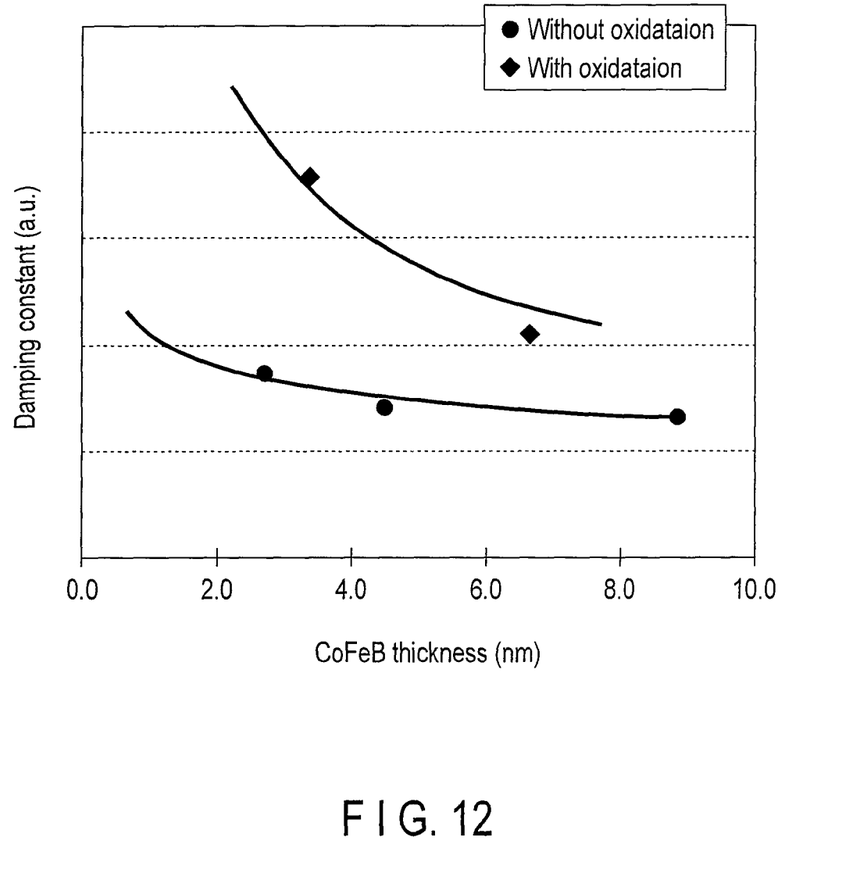
FIG. 12 is a graph showing the damping constants of CoFeB with and without oxidation.

More specifically, when an interface between the CoFeB layer of the storage layer 42 and the MgO layer of the tunnel barrier layer 43 is oxidized, the reversal energy barrier thereof are reduced. In addition, the MR ratio decreases. Furthermore, as shown in FIG. 12, the damping constant of the storage layer 42 decreases when CoFeB of the storage layer 42 is oxidized. That is, the reversal current of the storage layer 42 increases.

In addition, when an interface (Co layer side) of the Co layer and the Pt layer of the reference layer 44 (second magnetic layer 44c) is oxidized, the perpendicular magnetic anisotropy of the reference layer 44 decreases, and as a consequence the MR ratio decreases.

By contrast, in the present embodiment, the deactivated regions 42C and 44C having no magnetization are formed by deactivating the oxidized regions 42B and 44B having the unstable magnetic characteristics. Thereby, the unstable magnetic characteristics can be eliminated, so that the decreasing of MR ratio, the decreasing of reversal energy barrier, and the increasing of reversal current are suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
   a conductive layer containing a first metal material;
   a stacked body formed above the conductive layer, and comprising a first magnetization film containing a second metal material, a second magnetization film, and a tunnel barrier layer formed between the first magnetization film and the second magnetization film; and
   an insulating layer formed on a side face of the stacked body, and containing an oxide of the first metal material,
   wherein the first magnetization film and/or the second magnetization film includes a first region positioned in a central portion and a second region positioned in an edge portion, the second region containing As, P, Ge, Ga, Sb, In, Ar, He, F, CI, Br, I, Si, B, C, Zr, Tb, S, Se, or Ti.

2. The memory of claim 1, wherein the first region of the first magnetization film contains CoFeB, and the second region of the first magnetization film further contains CoFeB and O.

3. A magnetic memory comprising:
   a conductive layer containing a first metal material;
   a stacked body formed above the conductive layer, and comprising a first magnetization film containing a second metal material, a second magnetization film, and a tunnel barrier layer formed between the first magnetization film and the second magnetization film; and
   an insulating layer formed on a side face of the stacked body, and containing an oxide of the first metal material,
   wherein the first magnetization film and/or the second magnetization film includes a first region positioned in a central portion and a second region positioned in an edge portion, the second region containing As, P, Ge, Ga, Sb, In, N, Ar, He, F, CI, Br, I, Si, B, C, O, Zr, Tb, S, Se, or Ti, and
   wherein the second magnetization film comprises a first magnetic layer, a nonmagnetic layer, and a second magnetic layer which are sequentially formed from a side of the tunnel barrier layer.

4. The memory of claim 3, wherein:
   the first region of the second magnetization film contains CoFeB in the first magnetic layer, contains Ta, W, or Hf in the nonmagnetic layer, and contains Pt and Co in the second magnetic layer, and
   the second region of the second magnetization film further contains CoFeB and O in the first magnetic layer, further contains Ta, W, or Hf and O in the nonmagnetic layer, and further contains Pt, Co, and 0 in the second magnetic layer.

5. The memory of claim 1, wherein a standard electrode potential of the first metal material is lower than a standard electrode potential of the second metal material.

6. The memory of claim 5, wherein the second metal material contains Fe.

7. The memory of claim 6, wherein the first metal material contains one of Ta, Zn, Cr, Nb, V, Mn, Zr, Pa, Hf, Ti, Al, Be, Sc, Nd, Gd, Tb, lu, and Dv, and an alloy containing not less than two thereof.

8. The memory of claim 1, wherein the conductive layer is a lower electrode in contact with a semiconductor substrate.

9. The memory of claim 1, wherein the conductive layer is an underlying layer in contact with the stacked body.

* * * * *